United States Patent [19]
Hara

[11] Patent Number: 5,492,846
[45] Date of Patent: Feb. 20, 1996

[54] FABRICATION METHOD OF NONVOLATILE SEMICONDUCTOR MEMORY DEVICE

[75] Inventor: Hideki Hara, Tokyo, Japan

[73] Assignee: NEC Corporation, Tokyo, Japan

[21] Appl. No.: 334,318

[22] Filed: Nov. 1, 1994

[30] Foreign Application Priority Data

Nov. 1, 1993 [JP] Japan .................................. 5-273335

[51] Int. Cl.⁶ .............................................. H01L 21/8247
[52] U.S. Cl. ................................................ 437/43; 437/52
[58] Field of Search ...................... 437/43, 48, 52, 437/225, 233, 235, 238; 257/315

[56] References Cited

U.S. PATENT DOCUMENTS

| | | | |
|---|---|---|---|
| 5,021,848 | 6/1991 | Chiu | 437/43 |
| 5,073,513 | 12/1991 | Lee | 437/43 |

FOREIGN PATENT DOCUMENTS

| | | | |
|---|---|---|---|
| 76955 | 3/1992 | Japan | 257/315 |
| 129628 | 5/1993 | Japan | 257/315 |

OTHER PUBLICATIONS

Raul–Adrian Cernea et al., "A 1Mb Flash EEPROM", 1989 IEEE International Solid–State Circuits Conf., Digest of Technical Papers, Feb. 16, 1989, pp. 138–139 and 316.

*Primary Examiner*—Tom Thomas
*Attorney, Agent, or Firm*—Sughrue, Mion, Zinn, Macpeak & Seas

[57] ABSTRACT

A fabrication method of a split-gate type flash EEPROM with an improved data-storage characteristic. Insulator strips extending along a first direction are formed on a semiconductor substrate at intervals. The strips are in contact with active regions and a field insulator film. After a first gate insulator film is formed on uncovered parts of the active regions, respectively, a first patterned conductor film is formed to cover the insulator strips and the first gate insulator film. The first conductor film is anisotropically etched to produce floating gate electrodes lower in height than the stripes on the first gate insulator film without using a mask. Each of the floating gate electrodes has an oblique side face. A second gate insulator film is formed to cover the floating gate electrodes and exposed parts of the active regions. A second conductor film is formed to cover the second gate insulator film and the insulator strips. The second conductor film is etched back to flatten a surface of the second conductor film until tops of the strips are exposed. The second conductor film is patterned to produce control gate electrodes. After the insulator strips are removed, drain regions and source regions are formed in the active regions respectively.

19 Claims, 12 Drawing Sheets

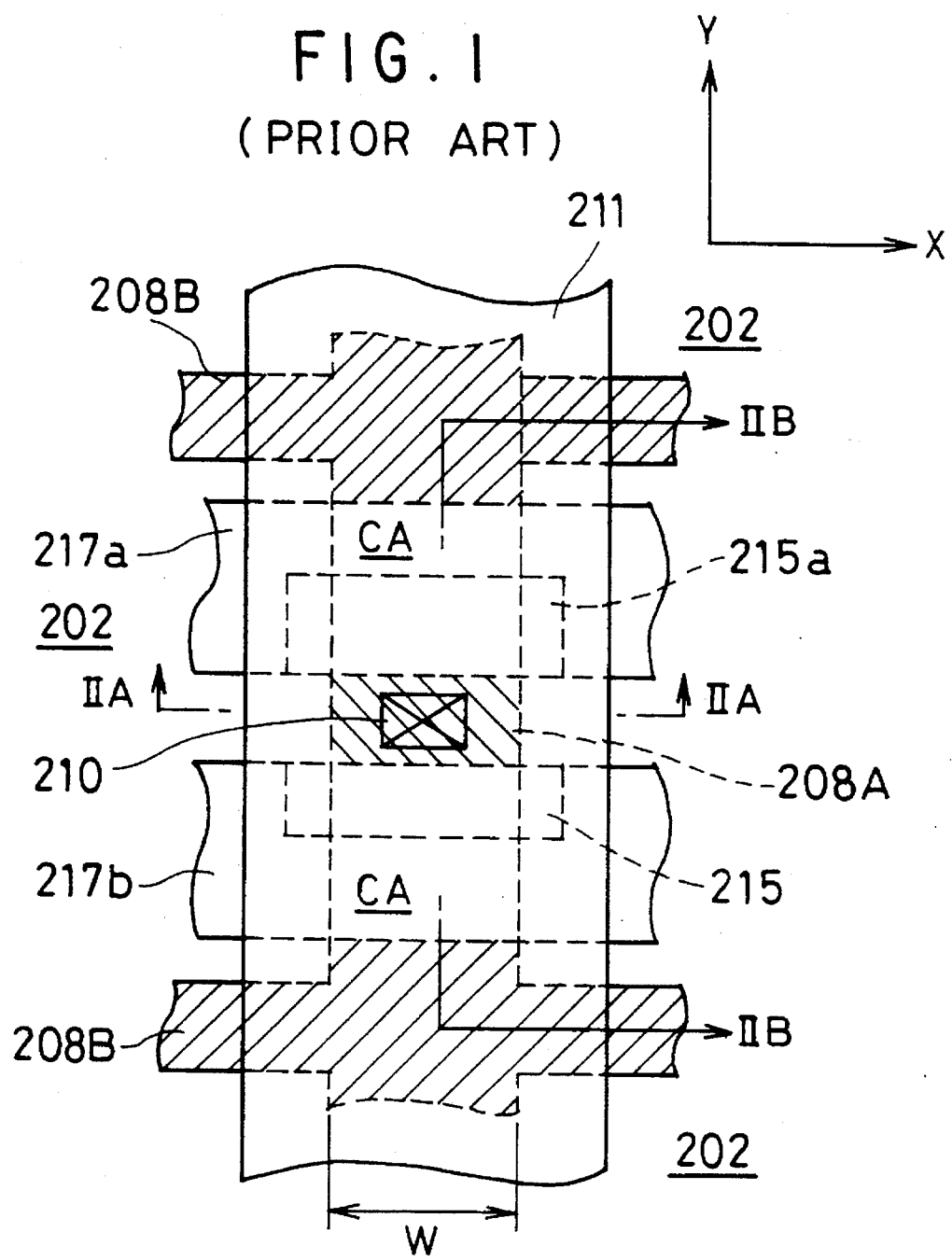

FABRICATION METHOD OF NONVOLATILE SEMICONDUCTOR MEMORY DEVICE

BACKGROUND OF THE INVENTION

1. Field of the Invention

The present invention relates to a fabrication method of a nonvolatile semiconductor memory device and more particularly, to a fabrication method of a flash Electrically Erasable Programmable Read-Only Memory (EEPROM) with the split-gate type memory cells.

2. Description of the Prior Art

A nonvolatile semiconductor memory device is one that retains its stored data even while power is off. Though several types of such devices have been developed, an Electrically Programmable ROM (EPROM) and a flash EEPROM are suitable for large-scale integration because their memory cell structures are advantageous to reduction in size.

The flash EEPROM can both electrically write or store data therein and electrically erase its stored data (in a specified area in a flash). Therefore, recently, the flash EEPROM has been attracting a great deal of attention because it will possibly replace magnetic memory devices in the future.

Stacked-gate and split-gate types are typically used in the memory cell structures of the flash EEPROM that have been developed.

Since the stacked-gate type memory cell structure is the same as the standard memory cell structure of the EPROM, it is advantageous for size-reduction. However, there is a disadvantage that the operational characteristics of the flash EEPROM deteriorate during an erase operation due to the overerase phenomenon.

On the other hand, the split-gate type memory cell structure, is advantageous in that the overerase phenomenon causes no problem in practical use.

FIGS. 1, 2A and 2B show a conventional split-gate type flash EEPROM, which is disclosed in ISSCC Digest of Technical Papers, 1989, pp 138, 139 and 316.

As shown in FIG. 1, on a P-type silicon substrate 201, a patterned field oxide film 202 formed to produce active regions by a local oxidation of silicon (LOCOS) method. A plurality of N$^+$-type source regions 208B with strip-like plane shapes are arranged in the active regions, respectively.

The drain regions 208A are placed in X and Y directions perpendicular to each other at regular intervals to form a matrix array, respectively.

The source regions 208B extend along the X direction and are placed in the Y direction at regular intervals. Each of the drain regions 208A is disposed between adjacent two ones of the source regions 208B in the Y direction. As shown in FIG. 1, one of the drain regions 208A and adjacent one of the source regions 208B form one memory cell. Each of the drain regions 208A is used in common by two ones of the memory cells adjacent to each other in the Y direction.

Each of the memory cells has a channel area CA with a rectangular plane shape between corresponding one of the drain regions 208A and corresponding one of the source regions 208B. The length of the channel area CA along the Y direction is nearly equal to the sum of gate lengths of a floating gate and a control gate, i.e., (÷Fa3+Sa3) or (÷Fa3+Sa3). The width of the channel area CA along the X direction is equal to a gate width W.

As shown in FIG. 1, each of the drain regions 208A has two ones of the channel areas CA placed at each side thereof in the Y direction.

The conventional flash EEPROM has a plurality of the memory cell pairs shown in FIG. 1. However, since these pairs are the same in configuration and function as each other, only one of the pairs will be described below for the sake of simplification of description.

Here, one cell of the memory cell pair at the left side in FIG. 2B is called a "first memory cell" and the other at the right side is called a "second memory cell".

With the first and second memory cells, as shown in FIG. 2B, first gate insulator films 204a and 204b with the same thickness of $d_0$ are selectively formed on the uncovered surface of the substrate 201 to cover drain-side parts thereof in the channel areas CA, respectively. These first gate insulator films 204a and 204b are made of silicon dioxide produced by thermal oxidation or the like. The drain-side ends of the gate insulator films 204a and 204b cover the source-side ends of the drain region 208A also, respectively. The lengths of the films 204a and 204b in the Y direction are nearly equal to Fa3 and Fb3, respectively.

Floating gate electrodes 215a and 215b, which are made of a first conductor such as polysilicon, are formed on the first gate insulator films 204a and 204b, respectively. The gate lengths Fa3 and Fb3 of the gate electrodes 215a and 215b are $L_1$.

The gate electrodes 215a and 215b extend to the field oxide film 202 in the X direction at each side of the drain region 208A, as shown in FIG. 1.

The floating gate electrodes 215a and 215b have rectangular top faces and four vertical side faces almost perpendicular to the substrate 201, respectively.

Second gate insulator films 206a and 206b with the same thickness of $d_1$ are selectively formed to cover the top faces of the floating gate electrodes 215a and 215b and the remaining uncovered surface of the substrate 201, respectively. The films 206a and 206b also cover the vertical side faces of the gate electrodes 215a and 215b except for their vertical side faces near the drain region 208A, respectively. These second gate insulator films 206a and 206b are made of silicon dioxide produced by thermal oxidation or the like.

The drain-side ends of the source regions 208B are also covered with the second gate insulator films 206a and 206b, respectively.

Control gate electrodes 217a and 217b are formed on the second gate insulator films 206a and 206b to cover the floating gate electrodes 215a and 215b, respectively. The gate electrodes 217a and 217b are made of a second conductor such as polysilicon.

The widths of the control gate electrodes 217a and 217b in the Y direction are equal to the sum of the gate lengths $L_1$ and $L_2$ of the floating gates 215a and 215b and the control gates 217a and 217b, i.e., (=Fa3+Sa3) and (=Fa3+Sa3), respectively.

The vertical side faces of the control gates 217a and 217b at their drain-side ends are aligned with the corresponding vertical side faces of the floating gate electrodes 215a and 215b, respectively.

Word lines extending along the X direction are made of the second conductor to be united with a corresponding control gate electrodes 217a and 217b, respectively.

An interlayer insulator film 209 provided over the entirety of the substrate 201 to cover the control gate electrodes 217a and 217b, the word lines and the uncovered field oxide film 202. Bit contact holes 210 are provided in the interlayer insulator film 209 at the positions right above the respective drain regions 208A.

Bit lines 211 are formed on the interlayer insulator film 209 to extend along the Y direction. The bit lines 211 are arranged at regular intervals in the X direction. Each of the bit lines 211 is connected to the corresponding drain regions 208A arranged along the Y direction.

The floating gate electrodes 215a and 215b are entirely surrounded by the first gate insulator films 204a and 204b, the second gate insulator films 206a and 206b, and the interlayer insulator film 209, respectively.

With the conventional split-gate type flash EEPROM, as stated above, the first and second memory cells contain metal-oxide-semiconductor (MOS) select transistors with the control gate electrodes 217a and 217b the gate lengths Sa3 and Sb3 of which are $L_2$ and the gate widths of which are W, respectively.

Therefore, even if the overerase phenomenon occurs in any memory cell, no problem arises in a read operation for the other memory cells if the cell concerned is not selected by the corresponding select transistor.

As shown in FIGS. 1, 2A and 2B, the first and second memory cells also contain MOS storage transistors with the control gate electrodes 217a and 217b the gate lengths Fa3 and Fb3 of which are $L_1$ and the gate widths of which are W, respectively.

The above conventional flash EEPROM has the following problems.

The first problem relates to data-storage. The above conventional split-gate type EEPROM exhibits inferior data-storage compared to a stacked-gate type one. The reason is as follows:

In the conventional stacked-gate type flash EEPROM, the control gate covers only two sides or edges of the corresponding floating gate with a parallelepiped shape on the field oxide film.

On the other hand, in the conventional split-gate type flash EEPROM described above, the control gate 217a and 217b covers five sides or edges of the corresponding floating gate 215a and 215b with a parallelepiped shape and two apexes or vertexes thereof on the field oxide film 202. Therefore, the EEPROM of this type has more positions in which an electric field easily concentrates than the stacked-gate type one, resulting in deteriorations of the data-storage characteristic.

The electric field tends to concentrate in the vertexes of the floating gate 215a and 215b especially.

The second problem relates to the fabrication method. This problem is that the data-writing periods of time of the first and second memory cells where the drain regions 208A is commonly used are different from each other. This is chiefly due to the gate length difference between the floating gates 215a and 215b.

The inventor fabricated the conventional split-gate type flash EEPROM and investigated its data-writing characteristic under the following conditions.

The doped-impurity concentration of the P-type substrate 201 was in the range of $10^{18}$ to $10^{17}$ cm$^{-1}$. The first gate insulator films 204a and 204b were made of a patterned silicon dioxide film whose thickness $d_0$ is 10 nm. The second gate insulator films 206a and 206b were also made of a patterned silicon dioxide film whose thickness $d_1$ is 25 nm. The floating gate electrodes 215a and 215b were made of a patterned polysilicon film with a thickness of 150 nm. The floating gate electrodes 215a and 215b overlapped with the field oxide film 202 by 0.5 μm width at both sides of the electrodes 215a and 215b, respectively. The gate lengths $L_1$ of the floating gate electrodes 215a and 215b were 0.85 μm in design value; however, the obtainable lengths $L_1$ were in the range of 0.7 to 1.0 μm since the tolerance of the positional alignment was ±0.15 μm.

When a data value was written into the floating gate 215a of the first memory cell, a voltage $V_{PP}$ (for example, 12 V) was applied to the control gate electrode 217a and a voltage $V_{CC}$ (for example, 6 to 7 V) was applied to the drain region 208A through the corresponding bit line 211. At this time, control gate electrodes and bit lines corresponding to the other memory cells were retained at 0 V or grounded, and all source regions were also retained at 0 V including the source regions 208B of the first memory cell.

Therefore, a voltage $V_{TM}=V_{PP} \times]C_{21}/(C_1+C_{21})]$ was applied to the floating gate electrode 215a during the data write operation where $C_1$ was a capacitance between the floating gate electrode 215a and the substrate 201, $C_{21}$ was a capacitance between the floating gate electrode 215a and the control gate electrode 217a, and $C_{22}$ was a capacitance between the control gate electrode 217a and the substrate 201.

For example, when Fa3=1.0 μm in the first memory cell and Fb3=0.7 μm in the second memory cell, the fluctuation of the voltage $V_{TM}$ from its design value was in the range of −1 to +2% approximately, which was acceptable.

However, the data writing period $T_W$ of time varied in a large range even if the other tolerances other than the positional alignment were neglected. For example, if the design value of the data writing period $t_W$ was defined as $t_{WO}$, $t_W$ was in the range from 2.8 to 4.5·$t_{WO}$ in the first memory cell ($L_1$=Fa3=1.0 μm) and $t_W$ was in the range from 0.7 to 0.75 $t_{WO}$ in the second memory cell ($L_1$=Fb3=0.7 μm).

SUMMARY OF THE INVENTION

Accordingly, an object of the present invention is to provide a fabrication method of a flash EEPROM with the split-gate type memory cells that can produce a flash EEPROM of this type having an improved data-storage characteristics compared with the conventional one with the split-gate type memory cells.

Another object of the present invention is to provide a fabrication method of a flash EEPROM with the split-gate type memory cells that can produce a flash EEPROM of this type having an improved data-storage characteristics compared with the conventional one with the stacked-gate type memory cells.

Still another object of the present invention is to provide a fabrication method of a flash EEPROM with the split-gate type memory cells that can produce a flash EEPROM of this type having an improved data-writing characteristic compared with the conventional one with the split-gate type memory cells.

The fabrication method according to the first aspect of the present invention contains the steps of forming a first gate insulator film on a semiconductor substrate; forming a first conductor film on the first gate insulator film; anisotropically etching the first conductor film to produce floating gate electrodes without using a mask, each of the floating gate electrodes having at least one oblique or curved side face; forming a second gate insulator film to cover the floating gate electrodes and uncovered parts of the substrate; forming a second conductor film on the second gate insulator film;

and patterning the second conductor film to produce control gate electrodes.

Electric field concentration is restrained in the floating gate electrodes due to the at least one oblique or curved side face of the first conductor film, and obtainable gate lengths of the floating gate electrodes become substantially the same as each other.

The fabrication method according to a second aspect of the present invention contains the steps of forming a first gate insulator film on a semiconductor substrate; forming a first conductor film on the first gate insulator film; anisotropically etching the first conductor film to produce floating gate electrodes without using a mask, each of the floating gate electrodes having at least one oblique or curved side face; forming a second gate insulator film to cover the floating gate electrodes and uncovered parts of the substrate; forming a second conductor film on the second gate insulator film; and anisotropically etching the second conductor film to produce control gate electrodes, each of the control gate electrodes having at least one oblique or curved side face connected to a bottom face of the control gate electrode.

The fabrication method according to a third aspect of the present invention contains the steps of forming a first gate insulator film on a semiconductor substrate; forming a first conductor film on the first gate insulator film; patterning the first conductor film to produce floating gate electrodes without using a mask, each of the floating gate electrodes having at least one oblique or curved side face; forming a second gate insulator film to cover the floating gate electrodes and uncovered parts of the substrate; forming a second conductor film on the second gate insulator film; patterning the second conductor film to produce control gate electrodes; forming drain regions and source regions in the substrate in self-align to the control gate electrodes, respectively, each of the source regions being formed in self-align to the control gate electrodes which belong to different ones of the drain regions, respectively.

With the fabrication methods of the first, second and third aspects, since each of the floating gate electrodes has at least one oblique or curved side face, the floating gate electrodes have both no sharp side or edge and no apex or vertex.

As a result, in the flash EEPROM fabricated by the methods of these aspects, an electric field is difficult to concentrate in the floating gate electrodes. This means that the EEPROM has a better data-storing characteristic than not only the conventional split-gate type one but also the conventional stacked-gate type one.

Also, with the flash EEPROM, there is no fluctuation due to positional alignment tolerance such as a mask alignment tolerance because the floating gate electrodes require no lithography process. As a result, the gate lengths of the floating gate electrodes are ensured to be the same, providing an improved data-writing characteristic compared with the conventional one with the split-gate type memory cells.

BRIEF DESCRIPTION OF THE DRAWINGS

FIG. 1A is a schematically partial plan view of a conventional flash EEPROM with the split-gate type memory cells.

DESCRIPTION OF THE PREFERRED EMBODIMENTS

Figure 2A:
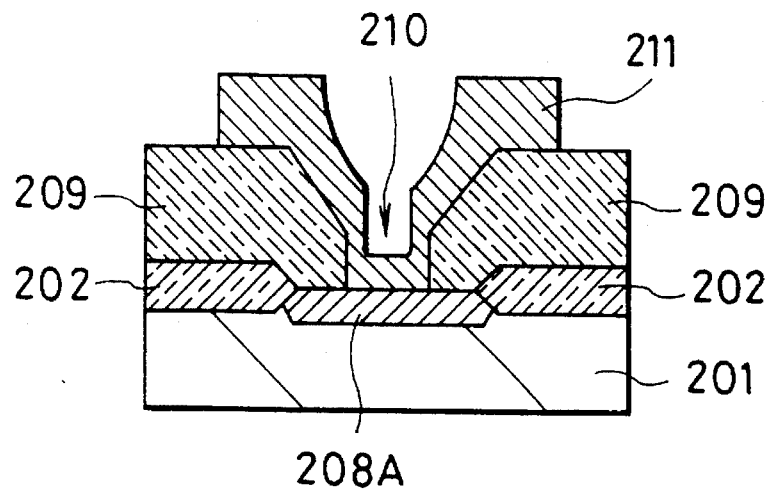
FIG. 2A is a cross section along the line IIA—IIA in FIG. 1.

Preferred embodiments of the present invention will be described below while referring to the drawings attached.

First Embodiment

Figure 3A:
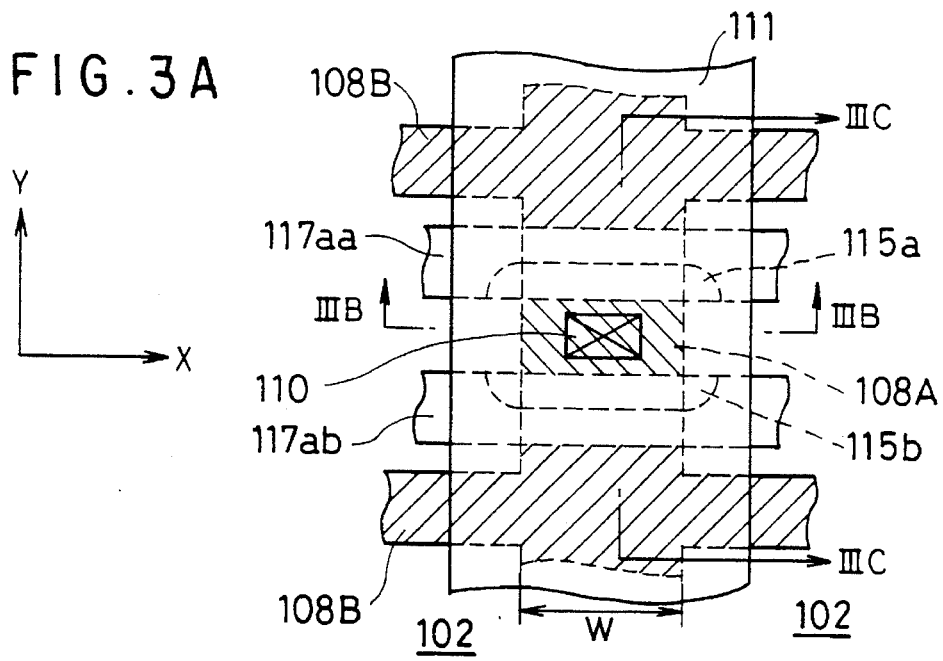
FIG. 3A is a schematically partial plan view of a flash EEPROM with the split-gate memory cells fabricated by a method according to a first embodiment of the present invention.
Figure 3B:
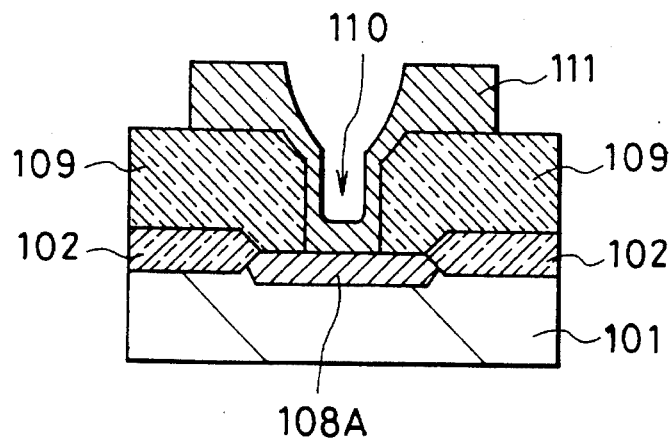
FIG. 3B is a cross section along the line IIIB—IIIB in FIG. 3A.
Figure 3C:
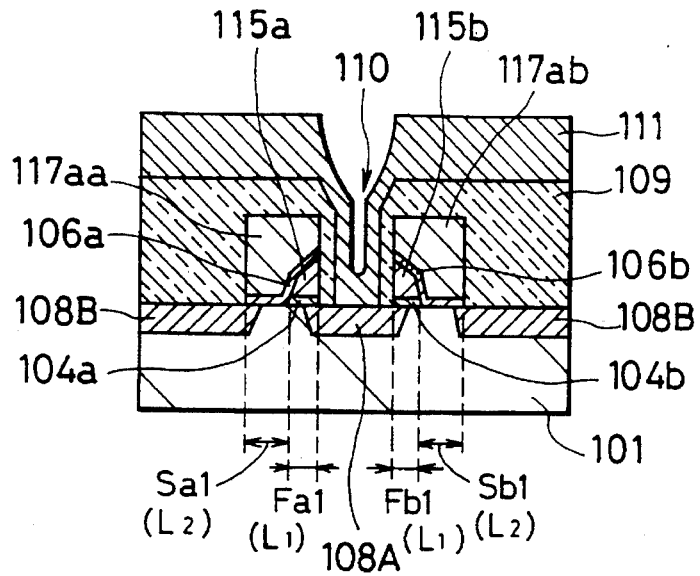
FIG. 3C is a cross section along the line IIIC—IIIC in FIG. 3A.

As shown in FIGS. 3A, 3B and 3C, on a P-type silicon substrate 101 with an impurity-doping concentration of $10^{16}$ to $10^{17}$ $cm^{-3}$, a patterned field oxide film 102 is formed to produce active regions by a LOCOS method. A plurality of $N^+$-type drain regions 108A with rectangular plane shapes and a plurality of $N^+$-type source regions 108B with strip-like plane shapes are arranged in the active regions, respectively.

The drain regions 108A are placed in X and Y directions perpendicular to each other at regular intervals to form a matrix array, respectively.

The source regions 108B are extending along the X direction and placed in the Y direction at regular intervals. Each of the drain regions 108A is disposed between adjacent two ones of the source regions 108B in the Y direction. As shown in FIG. 3A, one of the drain regions 108A and adjacent one of the source regions 108B form one cell memory. Each of the drain regions 108A is used in common by two ones of the memory cells adjacent to each other in the Y direction.

Each of the memory cells has a channel area CA with a rectangular plane shape between corresponding one of the drain regions 108A and corresponding one of the source regions 108B. The length of the channel area CA along the Y direction is nearly equal to the sum of gate lengths of a floating gate and a control gate, i.e., (÷Fa1+Sa1) or (÷Fa1+Sa1). The width of the channel area CA along the X direction is equal to a gate width W (for example, 1.2 μm).

As shown in FIG. 3A, each of the drain regions 108A has two ones of the channel areas CA placed at each side thereof in the Y direction.

The flash EEPROM as above has a plurality of the memory cell pairs shown in FIG. 3A. However, since these pairs are the same in configuration and function as each other, only one of the pairs will be described below for the sake of simplification of description.

Here, one cell of the pair at the left side of FIG. 3C is called a "first memory cell" and the other at the right side is called a "second memory cell".

With the first and second memory cells, as shown in FIG. 3C, first gate insulator films 104a and 104b with the same thickness of $d_0$ (for example, about 10 nm) are selectively formed on the uncovered surface of the substrate 101 to cover drain-side parts thereof in the channel areas CA, respectively. The drain-side ends of the gate insulator films 104a and 104b cover the source-side ends of the drain region 108A also, respectively. The lengths of the films 104a and 104b in the Y direction are nearly equal to Fa1 and Fb1, respectively.

These first gate insulator films 104a and 104b are made of a patterned silicon dioxide film produced by thermal oxidation. However, the films 104a and 104b may be made of a patterned insulator film produced by chemical vapor deposition (CVD) or the like. In this case, the ends of the films 104a and 104b extend over the field oxide film 102.

Floating gate electrodes 115a and 115b, which are made of a patterned N-type polysilicon film as a first conductor with a specified thickness (for example, about 200 nm), are formed on the first gate insulator films 104a and 104b, respectively.

The gate lengths Fa1 and Fb1 of the floating gate electrodes 115a and 115b are equal to each other to $L_1$, in other words, Fa1=Fb1=$L_1$.

The ends of the floating gate electrodes 115a and 115b extend over the field oxide film 102 in the X direction at each side of the drain region 108A by about 0.5 μm, as shown in FIG. 3A.

As shown in FIG. 3A, the floating gate electrodes 115a and 115b have approximately rectangular top faces each of which has two curved corners.

Also, as shown FIG. 3C, the floating gate electrode 115a has a trapezoidal or modified quadrangular cross section. In other words, the gate 115a has (a) a bottom face, (b) a vertical side face disposed at its drain-side (for example, about 200 nm in height), that is connected to the bottom face and is perpendicular to the bottom face or the substrate 101, (c) a first oblique side face disposed at its source-side, which is connected the bottom face at a large inclination angle to the bottom face, and (d) a second oblique side face disposed at its source-side, which is connected the first oblique side face at a small inclination angle to the bottom face. The second oblique side face is connected to the top end of the vertical side face.

The floating gate electrode 115a has the same cross section as that of the floating gate electrode 115b.

Second gate insulator films 106a and 106b with the same thickness of $d_1$ (for example, about 25 nm) are selectively formed to cover the first and second oblique side faces of the floating gate electrodes 115a and 115b and the remaining uncovered surface of the substrate 101, respectively.

The second gate insulator films 106a and 106b are made of a patterned silicon dioxide film produced by thermal oxidation. However, the films 106a and 106b may be made of a patterned insulator film such as silicon dioxide and silicon nitride films produced by CVD or the like, or a combination of these films. In this case, the ends of the films 104a and 104b extend over the field oxide film 102.

The drain-side ends of the source regions 108B are also covered with the second gate insulator films 106a and 106b, respectively.

Control gate electrodes 117aa and 117ab are formed on the second gate insulator films 106a and 106b to cover the floating gate electrodes 115a and 115b, respectively. The gate electrodes 117aa and 117ab are made of a second conductor such as a patterned polysilicon film.

The widths of the control gate electrodes 117aa and 117ab in the Y direction are equal to the sum of the gate lengths $L_1$ and $L_2$ of the floating gate electrodes 115a and 115b and the control gate electrodes 117aa and 117ab, i.e., (=Fa1+Sa1) and (=Fa1+Sa1), respectively.

The vertical side faces of the control gate electrodes 117aa and 117ab at their drain-side ends are aligned with the corresponding vertical side faces of the floating gate electrodes 115a and 115b, respectively.

Word lines extending along the X direction are made of the second conductor to be united with the corresponding control gate electrodes 117aa and 117ab, respectively.

An interlayer insulator film 109 is provided over the entirety of the substrate 101 to cover the control gate electrodes 117aa and 117ab, the word lines and the uncovered field oxide film 102. Bit contact holes 110 are provided in the interlayer insulator film 109 at the positions right above the respective drain regions 108A.

Bit lines 111 are formed on the interlayer insulator film 109 to extend along the Y direction. The bit lines 111 are arranged at regular intervals in the X direction. Each of the bit lines 111 is connected to the corresponding drain regions 108A arranged along the Y direction.

The floating gate electrodes 115a and 115b are entirely surrounded by the first gate insulator films 104a and 104b, the second gate insulator films 106a and 106b, and the interlayer insulator film 109, respectively.

The split-gate type flash EEPROM described above is fabricated by the following process steps:

First, on the silicon substrate 101, the patterned field oxide film 102 with a thickness of about 0.5 μm is formed by the LOCOS method to produce the isolated active regions.

Figure 4A:
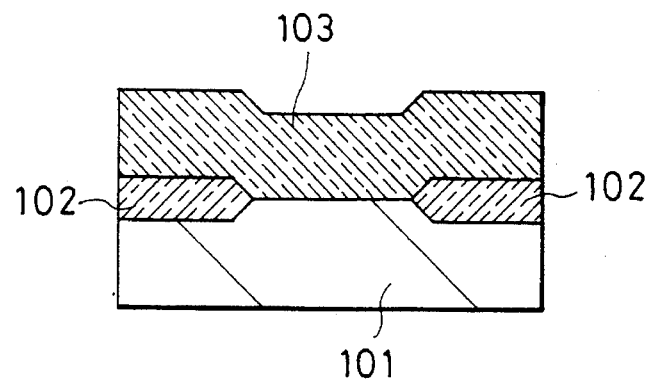
FIGS. 4A to 4G are cross sections along the line IIIB—IIIB in FIG. 3A showing the fabrication method of the flash EEPROM according to the first embodiment, respectively.
Figure 5A:
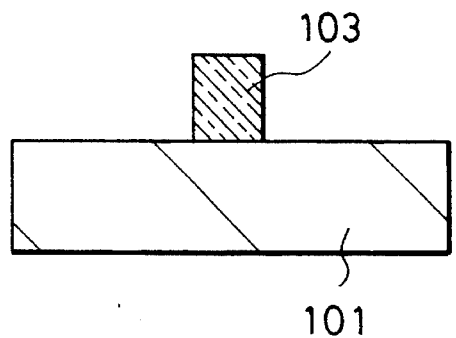
FIGS. 5A to 5G are cross sections along the line IIIC—IIIC in FIG. 3A showing the fabrication method of the flash EEPROM according to the first embodiment, respectively.

A silicon dioxide film 103 with a specified thickness such as about 500 nm is deposited on the active regions and the patterned field oxide film 102 all over the substrate 101 by atmospheric CVD. The silicon dioxide film 103 thus deposited is patterned to strips extending along the X direction and arranged at regular intervals in the Y direction by anisotropic etching, as shown in FIGS. 4A and 5A.

During this patterning process step, the field oxide film 102 is required not to be etched as much as possible.

The strips of the unetched silicon dioxide film 103 are running in parallel on the field oxide film 102.

Figure 5B:
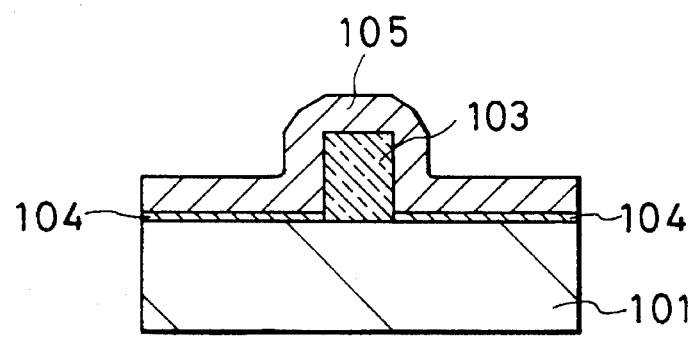

Next, as shown in FIG. 5B, a silicon dioxide film 104 with a specified thickness such as about 10 nm is formed on the active regions, i.e., the uncovered substrate 101 and on the field oxide film 102 to provide the first gate insulator films 104a and 104b. The film 104 is obtained by thermal oxidation of the substrate 101.

To form the floating gate electrodes 115a and 115b, an N-type polysilicon film 105 with a specified thickness such as about 200 nm is deposited all over the substrate 101 as the first conductor. The film 105 is then isotropically etched using a first photoresist film (not shown) formed on the film 105 so that the unetched polysilicon film 105 produces strips thereof. The polysilicon strips are extending along the Y direction and arranged at regular intervals in the X direction.

Figure 4B:
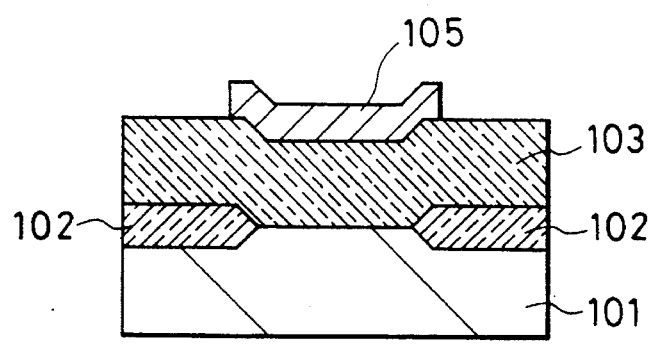
Figure 4C:
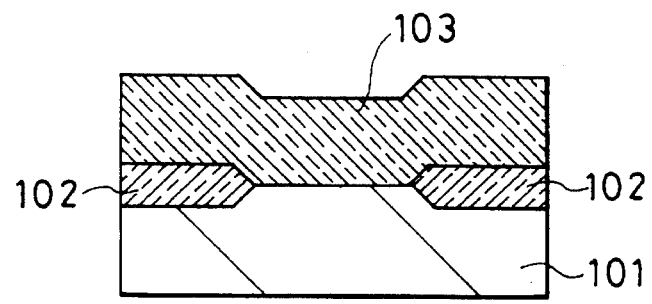

As shown in FIGS. 4B and 5B, each of the polysilicon strips overlaps with the corresponding field oxide film 102 by about 0.5 μm in the X direction, and covers the first gate oxide film 104 in the active regions.

Figure 5C:
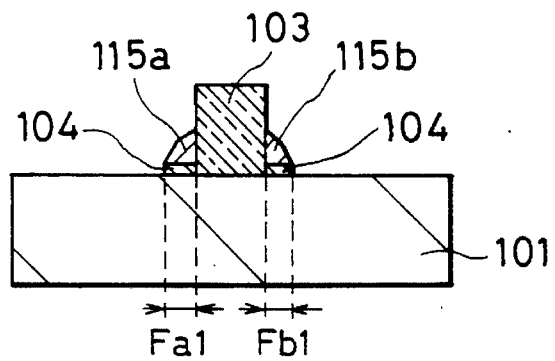

After removing the first photoresist film, the polysilicon or first conductor strips 105 are anisotropically etched to form the floating gate electrodes 115a and 115b, as shown in FIG. 5C. During this process step, the first gate insulator film 104 are also etched except for the parts underlying the floating gate electrodes 115a and 115b, and as a result, the surface of the substrate 101 is exposed in the active regions.

The anisotropical etching process of the polysilicon strips 105 is carried out by, for example, a dry etching process such as sputter-etching and plasma-etching ones.

The floating gate electrodes 115a and 115b are lower in height than the remaining silicon dioxide film 103.

The floating gate electrode 115a thus formed has a vertical side face contact with the silicon dioxide film 103. The vertical side face has a top connected to the field oxide film 102 along curved lines at its each side. The film 103 has a bottom face the drain-side end of which is connected to the vertical side face thereof. The source-side end of the bottom face has a straight line both sides of which are curved as shown in FIG. 3A. The gate electrode 115a has the first and second oblique side faces connected to each other. The bottom edge of the first oblique side face is connected to the bottom face and the top edge of the second oblique face is connected to the vertical side face.

The floating gate electrodes 115b is the same in structure as the floating gate electrode 115a.

The gate lengths Fa1 and Fb1 of the floating gate electrodes 115a and 115b are equal in value to $L_1$.

During the anisotropic etching process step of the polysilicon strips 105, the etching period of time is determined by adding a specified period to the period necessary for exposing the top face of the silicon dioxide film 103. As a result, the first gate insulator film 104 is also etched selectively.

The total fluctuations or variations of the lengths Fa1 and Fb1, which are equal to the sum of the fluctuation in thickness of the first conductor film 105 and that in etching progress of this process step, were within the range of ±10%.

In spite of the fluctuations or variations of the gate lengths Fa1 and Fb1, there is no fluctuation due to positional alignment tolerance in the first embodiment because the floating gate electrodes 115a and 115b require no lithography process.

As a result, in the memory cell pair as shown in FIGS. 3A, 3B and 3C, the same gate length $L_1$ of the electrodes 115a and 115b is ensured. In other words, Fa1=Fb1 is always established substantially.

Figure 4D:
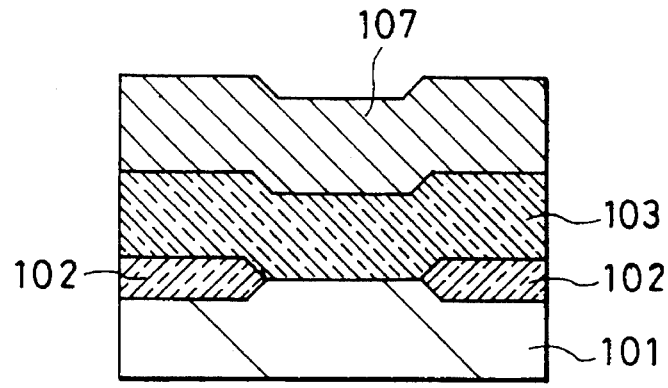
Figure 5D:
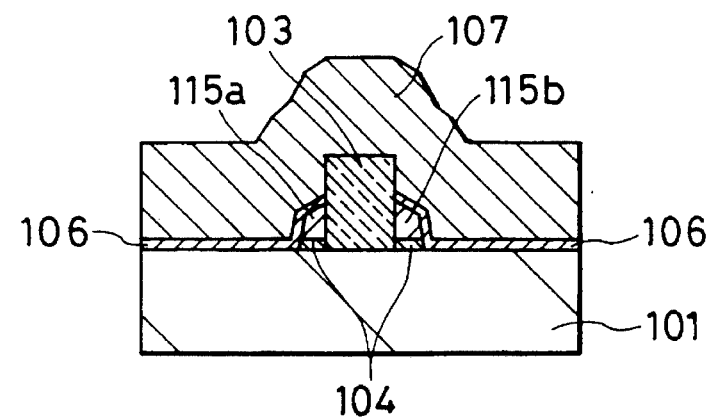

Subsequently, the second gate insulator film 106 with a thickness of $d_1$ (for example, about 25 nm) is formed on the floating gate electrodes 115a and 115b and the uncovered substrate 101. Then, the second conductor film 107 made of an N-type polysilicon film (for example, about 600 nm in thickness) is deposited all over the substrate 101, as shown in FIGS. 4D and 5D.

Figure 4E:
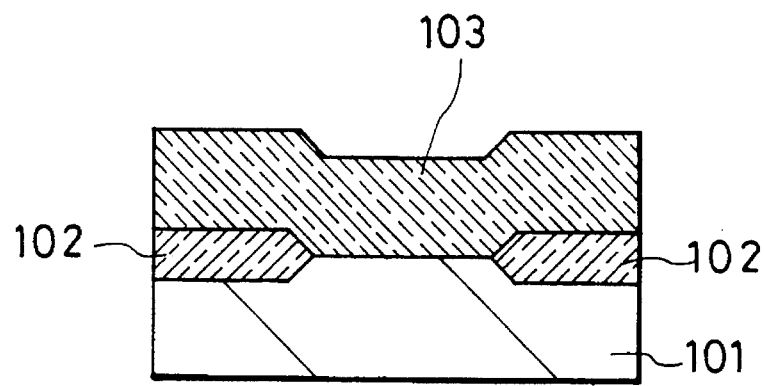
Figure 4F:
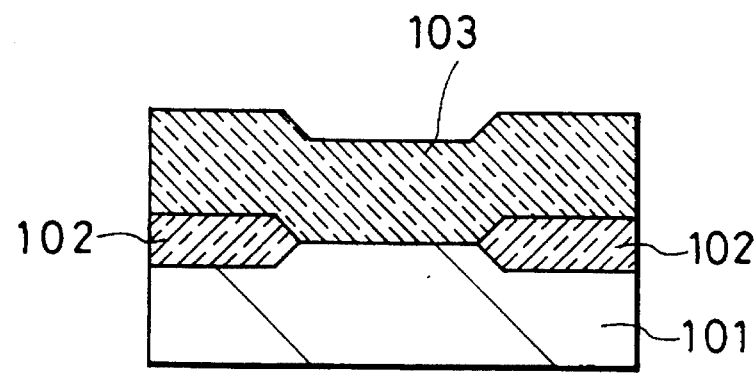
Figure 5E:
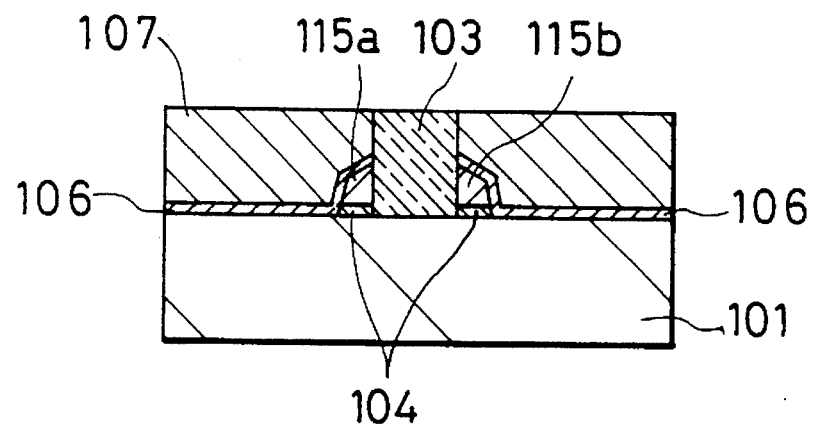

After a second photoresist film (not shown) is formed on the second conductor film 107, the second photoresist film and the second conductor film 107 are etched back until the top of the silicon dioxide film 103 is exposed from the film 107 entirely. Thus, as shown in FIGS. 4E and 5E, the surface of the film 107 becomes substantially flat.

A third photoresist film (not shown) is formed on the second conductor film 107, and then, the film 107 is selectively etched to produce the control gate electrodes 117aa and 117ab at both sides of each stripe made of the silicon dioxide film 103 using the photoresist film thus formed as a mask.

Figure 5F:
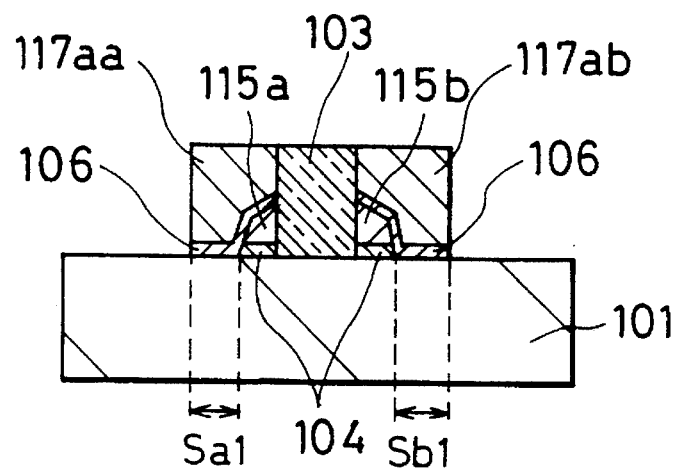

As shown in FIG. 5F, the lengths of the control gate electrodes 117aa and 117ab in the Y direction are (Fa1+Sa1) and (Fb1+Sb1), respectively. Sa1 and Sb1, which mean the gate lengths $L_2$ of the select transistors of the first and second memory cells respectively, are not equal to each other due to the positional alignment tolerance of the third photoresist film. Sa1÷Sb1 is established.

During the photolithography and etching process steps, the control gate electrodes 117aa and 117ab are separated at the ends of the strips of the silicon dioxide film 103 in the X direction. Also, gate electrodes for the peripheral circuitry of this EEPROM may be produced in this step.

Next, a fourth photoresist film (not shown) is formed all over the substrate 101 and is patterned to produce openings or windows on the respective strips of the silicon dioxide film 103. Then, using the fourth photoresist film thus patterned as a mask, the strips of the film 103 are selectively removed by etching.

Figure 4G:
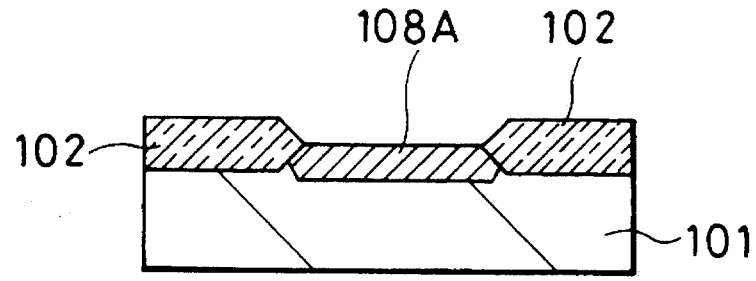
Figure 5G:
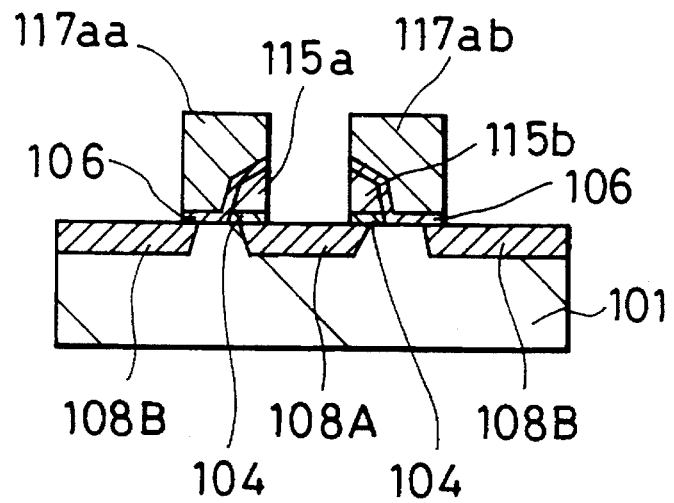

After removing the fourth photoresist film, the field oxide film 102 and the control gate electrodes 117aa and 117ab as a mask, dopant ions are implanted into the substrate 101 to produce the $N^+$-type drain regions 108A and the $N^+$-type source regions 108B in self-align, as shown in FIGS. 4G and 5G.

Finally, after the interlayer insulator film 109 is deposited all over the substrate 101, the bit contact holes 110 are formed in the film 109. Then, the bit lines 111 are formed on the film 109 to be contacted with the corresponding drain regions 108A. Thus, the flash EEPROM of the first embodiment as shown in FIGS. 3A, 3B and 3C is obtained.

As described above, with the split-gate type flash EEPROM fabricated by the method of the first embodiment, the first and second memory cells contain MOS select transistors with the control gate electrodes 117a and 117b the gate lengths of which are $L_2$ or Sa1 and Sb1 and the gate widths of which are W, respectively. Therefore, even if the overerase phenomenon occurs in any memory cell, no problem arises in a read operation for the other memory cells if the cell concerned is not selected by the corresponding select transistor.

Besides, as shown in FIGS. 3A, 3B and 3C, the first and second memory cells also contain MOS storage transistors with the control gate electrodes 117aa and 117ab the gate lengths of which are $L_1$ or Fa1 and Fb1 and the gate widths of which are W, respectively.

Figure 2B:
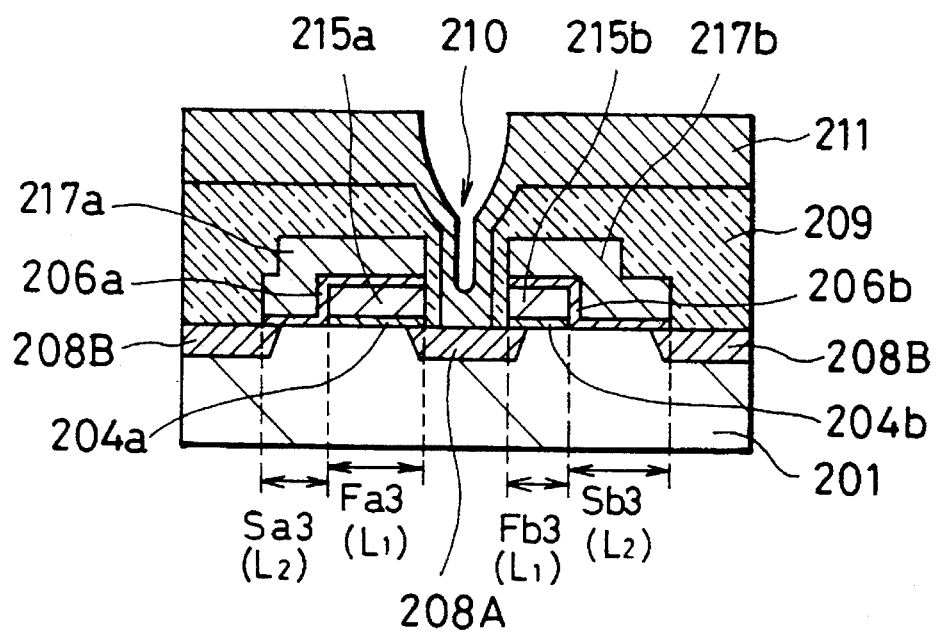
FIG. 2B is a cross section along the line IIB—IIB in FIG. 1.

In addition, though the control gate electrodes 117aa and 117ab cover the first oblique side faces and second oblique side faces of the floating gate electrodes 115a and 115b, respectively, there is no sharp side or edge and no apex or vertex at the connection points of the first and second oblique side faces, which is different from the conventional flash EEPROM shown in FIGS. 1, 2A and 2B.

Therefore, in the flash EEPROM fabricated by the method of the first embodiment, an electric field is difficult to concentrate in the floating gate electrodes 115a and 115b. This means that this EEPROM has a better data-storage characteristic than not only the conventional split-gate type one but also the conventional stacked-gate type one.

Further, with the fabrication method of the first embodiment, since the first and second memory cells in which the drain region 108A is used in common can have the same gate length of the floating gate electrodes 117aa and 117ab, they have the same applied voltage $V_{TM}$ and the same data-writing period of time. As a result, the fabrication method of the first embodiment can produce a drastically improved data-writing characteristic.

However, as stated above, there is the thickness fluctuation of the conductor film 105 and the etching progress fluctuation of the anisotropically etching process step for producing the floating gate electrodes 115a and 115b from the conductor film 115. As a result, there was a gate length ($L_1$) fluctuation within ±10% between two memory cells placed apart from each other at a sufficient distance. Also in this case, these two memory cells had the almost the same applied voltage, $V_{TM}$.

For example, when the first gate insulator film 104 was a silicon dioxide film obtained by thermal oxidation, the thickness $d_0$ of which was about 10 nm, the second gate insulator film 106 was a silicon dioxide film obtained by thermal oxidation, the thickness $d_1$ of which was about 25 nm, and the conductor film 105 was an N-type polysilicon film with the thickness of about 200 nm, the design value of the gate length $L_1$ (=Fa1+Fb1) was 200 nm, the fluctuation of the gate length $L_1$ was found within ±20 nm i.e., ±10%.

The data writing period $t_W$ of time in the first embodiment was $0.9\ t_{WO} < t_W < 1.3\ t_{WO}$ where $t_{WO}$ was defined as its design value. Such a fluctuation of $t_W$ is less than that of the conventional split-gate type one described above where the fluctuations in the process steps other than the positional alignment is neglected. This means that the split-gate type flash EEPROM of the first embodiment can be improved in data-writing characteristic drastically.

Second Embodiment

FIGS. 6A, 6B, 6C, 7A and 7B show a fabrication method according to a second embodiment of the present invention.

Figure 6A:
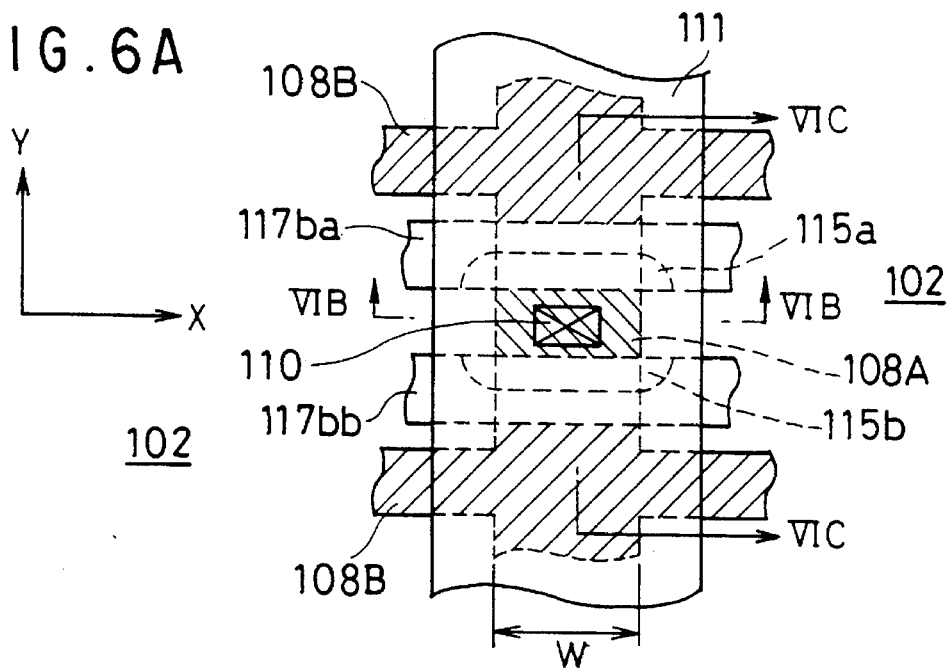
FIG. 6A is a schematically partial plane view of a flash EEPROM with the split-gate type memory cells fabricated by a method according to a second embodiment of the present invention.
Figure 6B:
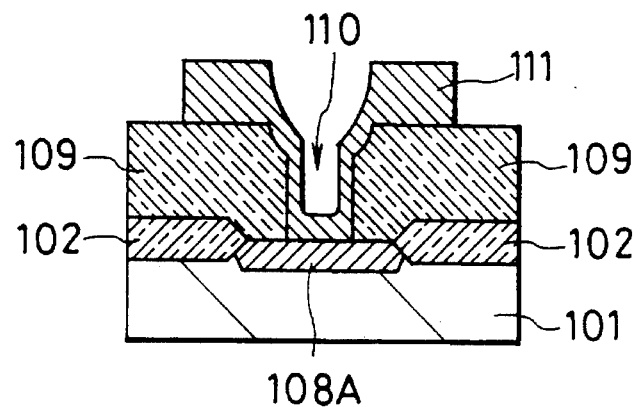
FIG. 6B is a cross section along the line VIB—VIB in FIG. 5A.
Figure 6C:
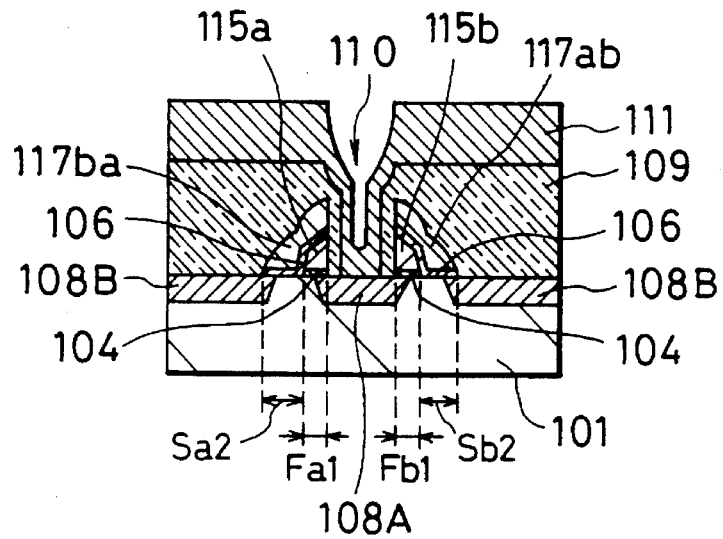
FIG. 6C is a cross section along the line VIC—VIC in FIG. 5A.

As shown in FIGS. 6A, 6B and 6C, the split-gate type flash EEPROM fabricated by the method of the second embodiment has substantially the same structure as that of the first embodiment other than the control gate electrodes 117ba and 117bb made of the patterned second conductor film are different in shape from those of the first embodiment.

The control gate electrode 117ba has an oblique side face the top end of which is connected to the top end of the vertical side face of the electrode 117ba and the bottom end of which is connected to the source-side end of the bottom face of the electrode 117ba. The inclination angle of the oblique side face is about 45°.

The control gate electrode 117bb is the same in structure as the control gate electrode 117ba.

In the EPROM fabricated by the method of the second embodiment, the first and second memory cells in which the drain regions 108A is commonly used have not only the same gate length $L_1$ of the floating gate electrodes 115a and 115b but also the same gate length $L_2$ of the select transistors, that is, $L_2$=Sa2=Sb2.

Figure 7A:
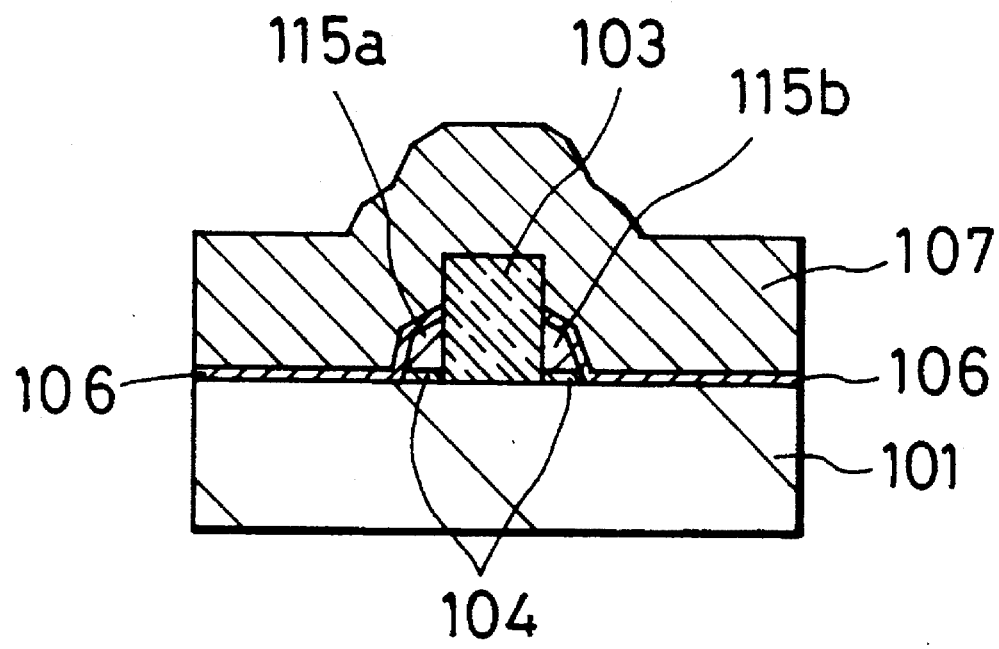
FIG. 7A is a cross section along the VIB—VIB in FIG. 6A showing the fabrication method of the flash EEPROM according to the second embodiment.

The split-gate type flash EEPROM shown in FIGS. 6A, 6B and 6C is fabricated by the following process steps:

In the same way as the first embodiment, the patterned silicon dioxide film 103 is formed and the first gate insulator film 104 is selectively formed. Then, the first conductor film 105 is formed to be patterned by isotropically etching using the first photoresist film. The first conductor film 104 thus patterned is anisotropically etched to produce the floating gate electrodes 115a and 115b. After that, in the same way as the first embodiment, the second gate insulator film 106 is formed and the second conductor film 107 is deposited, as shown in FIG. 7A.

Figure 7B:
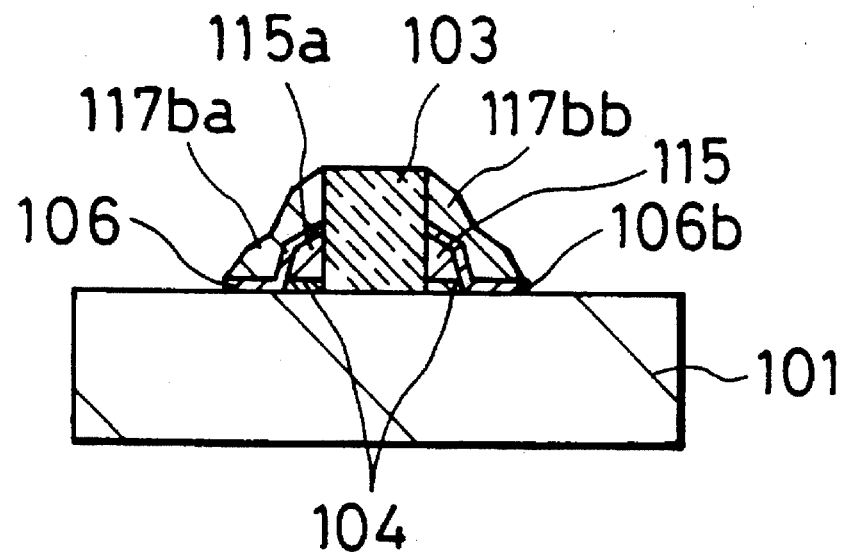
FIG. 7B is a cross section along the line VIC—VIC in FIG. 6A showing the fabrication method of the flash EEPROM according to the second embodiment.

Subsequently, the second conductor film 107 is anisotropically etched until the top face of the strip of the silicon dioxide film 103 is exposed from the film 107. Thus, the control gate electrodes 117ba and 117bb are produced. At the same time, the second gate insulator film 106 is selectively removed except for the parts underlying the floating gate electrodes 115a and 115b, as shown in FIG. 7B.

Next, though not shown, after the second photoresist film is formed on all over the substrate 101 is patterned to produce openings or windows on the respective strips of the silicon dioxide film 103. Then, using the second photoresist film thus patterned as a mask, the strips of the film 103 are selectively removed by etching.

After removing the second photoresist mask, the field oxide film 102 and the control gate electrodes 117ba and 117bb as a mask, dopant ions are implanted into the substrate 101 to produce the $N^+$-type drain regions 108A and the $N^+$-type source regions 108B in self-align, as shown in FIGS. 6A, 6B and 6C.

Finally, after the interlayer insulator film 109 is deposited all over the substrate 101, the bit contact holes 110 are formed in the film 109. Then, the bit lines 111 are formed on the film 109 to be contacted with the corresponding drain regions 108A. Thus, the flash EEPROM of the second embodiment as shown in FIGS. 6A, 6B and 6C is obtained.

As described above, with the flash EEPROM fabricated by the fabrication method of the second embodiment, the same data-storing characteristic and the same data-writing characteristic can be obtained as those in the first embodiment.

In addition, compared with the first embodiment, the first and second memory cells in which the drain region 208A is commonly used have the same gate length $L_2$ of the select transistors. As a result, there arises an advantage of less fluctuation in data-writing characteristics of the first and second memory cells.

Further, there is another advantage that the count of lithography process can be reduced compared with first embodiment and as a result, the memory cells can be integrated on larger-scale in the Y direction than the first embodiment.

Third Embodiment

FIGS. 8A to 8C, 9A to 9D, and 10A to 10D show a fabrication method according to a third embodiment of the present invention.

The split-gate type flash EEPROM fabricated by the method of the third embodiment has almost the same structure as that of the second embodiment; however, a field oxide film 122a and N+-type source regions 128B have different shapes from those of the second embodiment and different positional relationships among the film 122a, the source regions 128B and the control gate electrodes 117ba and 117bb from those of the second embodiment.

Figure 8A:
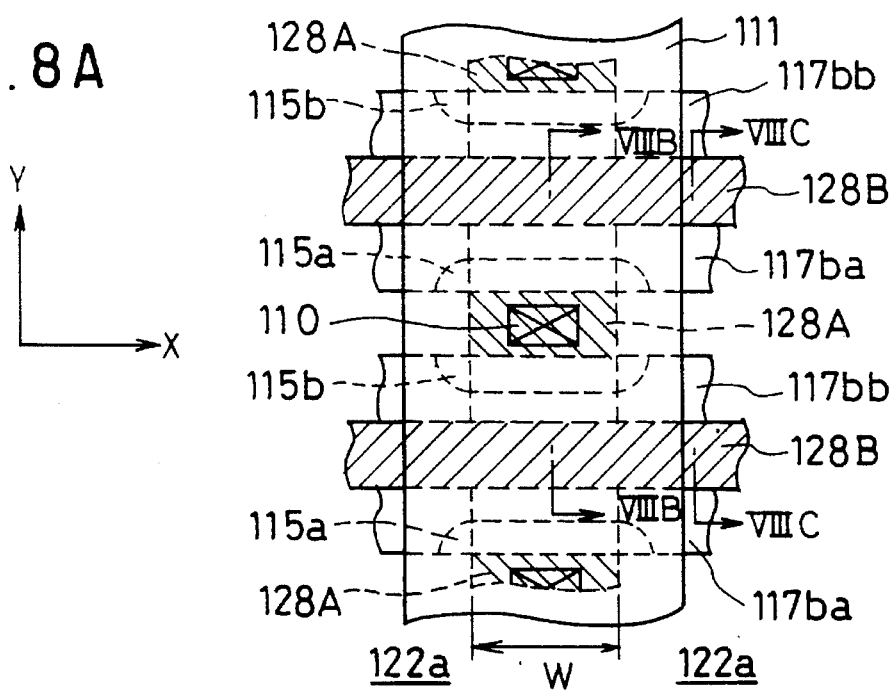
FIG. 8A is a schematically partial plan view of a flash EEPROM with the split-gate type memory cells fabricated by a method according to a third embodiment of the present invention.

As shown in FIG. 8A, the boundary between the source region 128B and the channel areas of the select transistor is aligned with the boundary between the field oxide film 122a adjacent to the channel and the source region 128B. In other words, each of the source regions 128B is formed in self-alignment to the control gate electrodes 117ba and 117bb both of which belong to the different drain regions 128A, respectively.

Figure 8B:
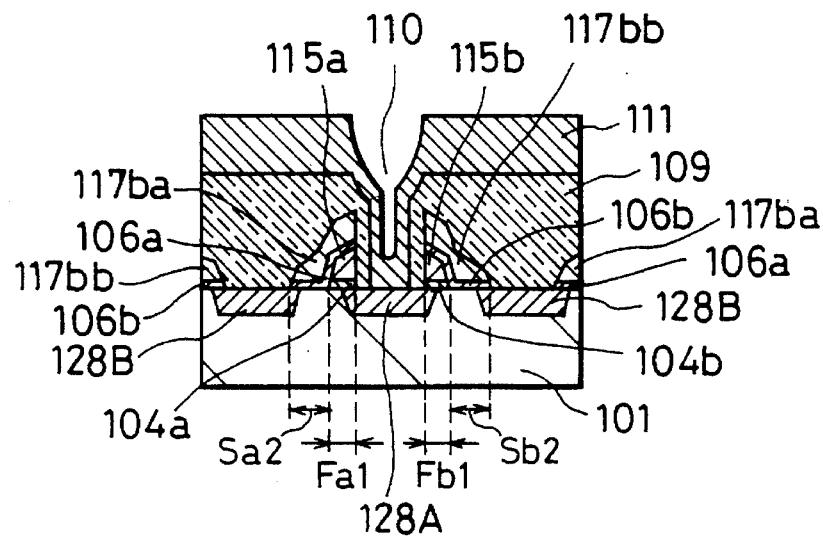
FIG. 8B is a cross section along the line VIIIB—VIIIB in FIG. 8A.
Figure 8C:
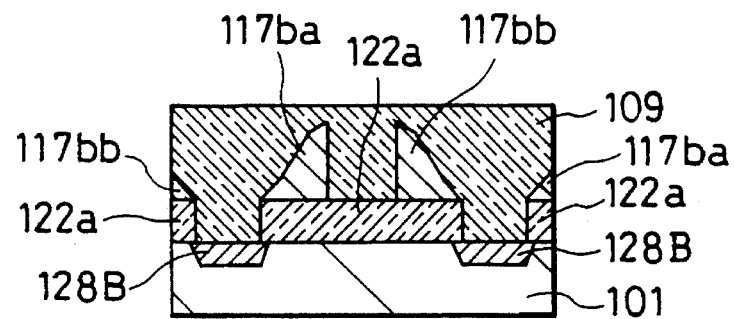
FIG. 8C is a cross section along the line VIIIC—VIIIC in FIG. 8A.

The split-gate type flash EEPROM shown in FIGS. 8A, 8B and 8C is fabricated by the following process steps:

First, on the P-type silicon substrate 101, the patterned field oxide film 102 with a thickness of about 0.5 µm is formed by the LOCOS method to produce the isolated active regions.

In the same way as those of the first and second embodiments, a silicon dioxide film with a specified thickness such as about 500 nm is formed on the active regions and the patterned field oxide film 103 all over the substrate 101.

Figure 9A:
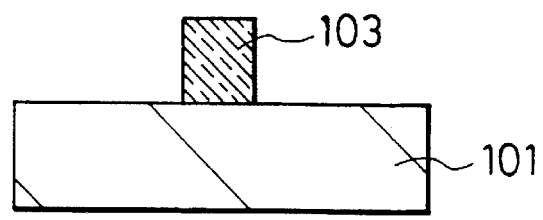
FIGS. 9A to 9D are cross sections along the line VIIIB—VIIIB in FIG. 8A showing the fabrication method of the flash EEPROM according to the third embodiment, respectively.
Figure 10A:
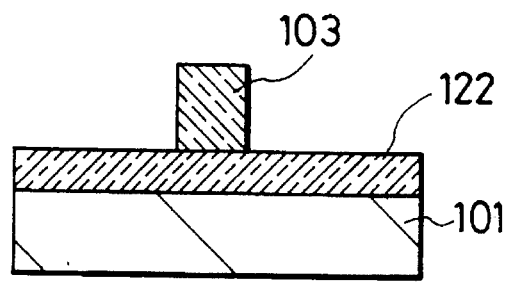
FIGS. 10A to 10D are cross sections along the line VIIIC—VIIIC in FIG. 8A showing the fabrication method of the flash EEPROM according to the third embodiment, respectively.

The silicon dioxide film 103 thus deposited is patterned to strips extending along the X direction and arranged at regular intervals in the Y direction by anisotropic etching, as shown in FIGS. 9A and 10A.

Next, in the same way as those of the first and second embodiments, the first gate insulator films 104a and 104b are provided, and then, the N-type polysilicon film 105 is deposited all over the substrate 101 as the first conductor. The film 105 is then isotropically etched using a first photoresist film (not shown) formed on the film 105 so that the unetched polysilicon film 105 forms strips.

Figure 9B:
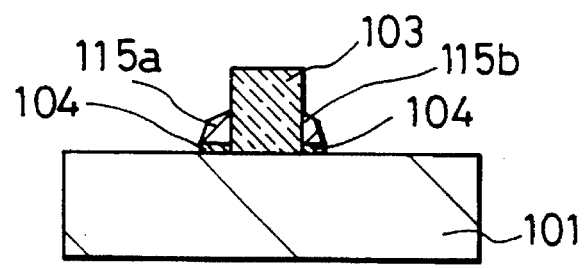
Figure 10B:
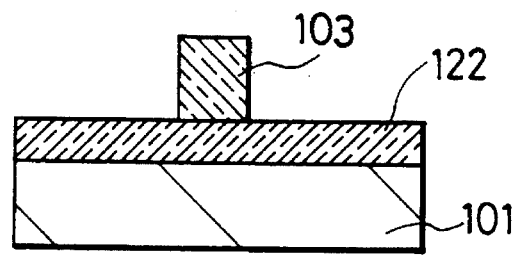

After removing the first photoresist film, in the same way as those of the first and second embodiments, the conductor or polysilicon film 105 unetched are anisotropically etched to form the floating gate electrodes 115a and 115b, as shown in FIGS. 9B and 10B.

Figure 9C:
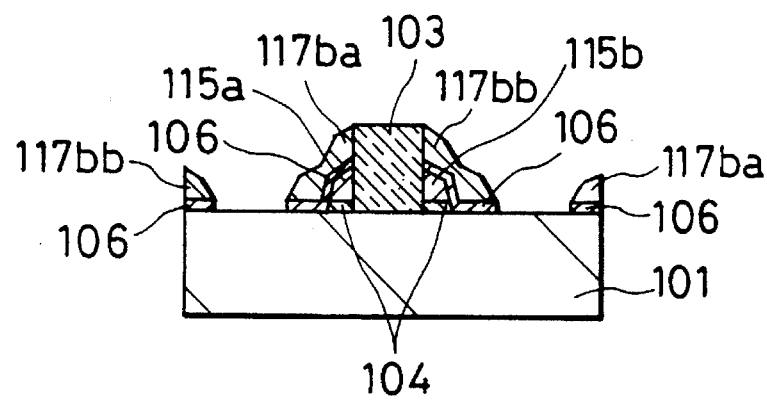
Figure 10C:
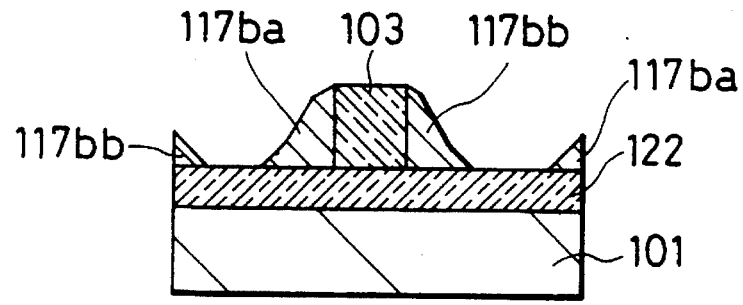

Then, in the same way as that of the second embodiment, the second gate insulator film 106 is formed on the floating gate electrodes 115a and 115b and the uncovered substrate 101. Then, the second conductor film 107 made of an N-type polysilicon film is deposited all over the substrate 101. After a second photoresist film (not shown) is formed on the second conductor film 107, the second conductor film 107 is anisotropically etched to from the control gate electrodes 117ba and 117bb, as shown in FIGS. 9C and 10C.

Figure 10D:
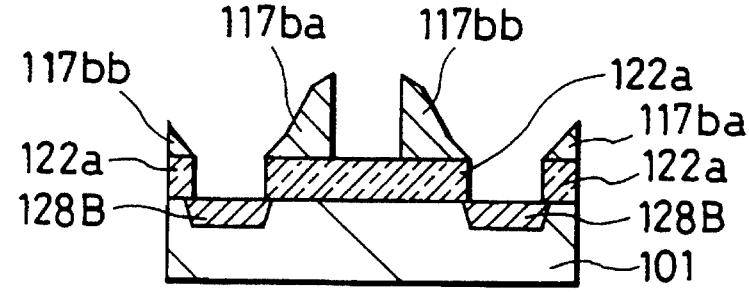

Both of the uncovered field oxide film 122 and the silicon dioxide film 103 are selectively removed by etching to form silicon dioxide films 122a, as shown in FIGS. 10D.

During this process step, since the property of the silicon dioxide film 103 has already been changed to that similar to a silicon dioxide film produced by thermal oxidation due to heat-treatment processes for making the first and second conductor films N-type or the like, the uncovered field oxide film 122 and the silicon dioxide film 103 are removed almost at the same time.

If the removing rate difference between the film 122 and 103 is large, after one of the films 122 and 103 is removed, the portions thus removed may be covered with another photoresist film.

Figure 9D:
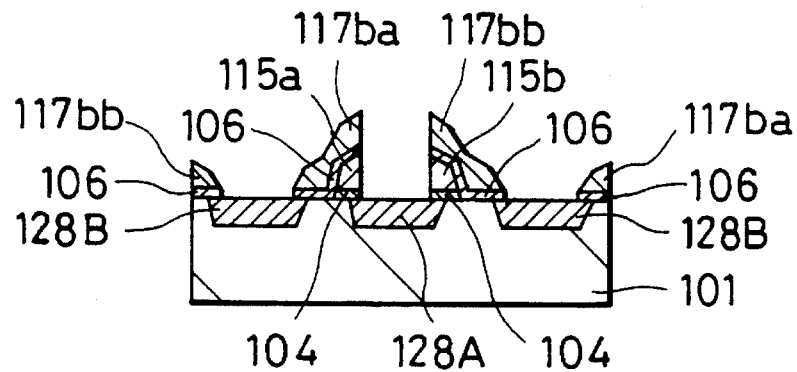

After removing the second photoresist film, the control gate electrodes 117ba and 117bb as a mask, dopant ions are implanted into the substrate 101 to produce the N+-type drain regions 128A and the N+-type source regions 128B in self-alignment, as shown in FIGS. 9D and 10D.

Finally, after the interlayer insulator film 109 is deposited all over the substrate 101, the bit contact holes 110 are formed in the film 109. Then, the bit lines 111 are formed on the film 109 to be contacted with the corresponding drain regions 108A. Thus, the flash EEPROM of the third embodiment is obtained.

As described above, with the flash EEPROM fabricated by the fabrication method of the third embodiment, the same data-storing characteristic and the same data-writing characteristic can be obtained as those in the second embodiment.

In addition, there is an advantage that the number of steps in the lithography process can be reduced compared with the second embodiment and as a result, the memory cells can be integrated on larger-scale in the Y direction than the conventional one. The integration scale in the Y directions can be larger than that of the second embodiment.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. In a fabrication method of a flash electrically erasable programmable read-only memory device with the split-gate type memory cells, said method comprising the steps of:

forming a first gate insulator film on a semiconductor substrate;

forming a first conductor film on said first gate insulator film;

anisotropically etching said first conductor film to produce floating gate electrodes without using a mask and to expose a portion of said substrate, each of said floating gate electrodes having at least one oblique or curved side face;

forming a second gate insulator film to cover said floating gate electrodes and said exposed portion of said substrate;

forming a second conductor film on said second gate insulator film; and patterning said second conductor film to produce control gate electrodes;

wherein electric field concentration is restrained in said floating gate electrodes due to said at least one oblique or curved side face of said first conductor film, and gate lengths of said floating gate electrodes are substantially equal.

2. The method as claimed in claim 1, wherein each of said floating gate electrodes has a first oblique side face connected to a bottom face of said floating gate electrode at a first predetermined inclination angle to said bottom face, and a second oblique side face connected to said first oblique side face at a second predetermined inclination angle to said bottom face wherein said first predetermined angle is greater than said second predetermined angle.

3. The method as claimed in claim 1, wherein each of said control gate electrodes has at least one oblique or curved side face connected to a bottom face of said control gate electrode.

4. The method as claimed in claim 3, further comprising a step of anisotropically etching said control gate electrodes to form said oblique or curved side faces of said control gate electrodes.

5. In a fabrication method of a flash electrically erasable programmable read-only memory device with the split-gate type memory cells, said method comprising the steps of:

forming a first gate insulator film on a semiconductor substrate;

forming a first conductor film on said first gate insulator film;

anisotropically etching said first conductor film to produce floating gate electrodes without using a mask and to expose a portion of said substrate, each of said floating gate electrodes having at least one oblique or curved side face;

forming a second gate insulator film to cover said floating gate electrodes and said exposed portion of said substrate;

forming a second conductor film on said second gate insulator film; and anisotropically etching said second conductor film to produce control gate electrodes, each of said control gate electrodes having at least one oblique or curved side face connected to a bottom face of said control gate electrode;

wherein electric field concentration is restrained in said floating gate electrodes due to said at least one oblique or curved side face of said first conductor film, and gate lengths of said floating gate electrodes are substantially equal.

6. The method as claimed in claim 1, wherein each of said floating gate electrodes has a first oblique side face connected to a bottom face of said floating gate electrode at a first predetermined inclination angle to said bottom face, and a second oblique side face connected to said first oblique side face at a second predetermined inclination angle to said bottom face, wherein said first predetermined angle is greater than said second predetermined angle.

7. A fabrication method of a flash electrically erasable programmable read-only memory device with the split-gate type memory cells, said method comprising the steps of:

(a) forming a patterned field insulator film on a semiconductor substrate to produce active regions at said substrate and uncovered parts of said substrate, said active regions being arranged at intervals in a first direction and a second direction perpendicular to said first direction;

(b) forming insulator strips extending along said first direction on said substrate at intervals, said strips being in contact with said active regions and said field insulator film;

(c) selectively forming a first gate insulator film on uncovered parts of said substrate, respectively;

(d) forming a first patterned conductor film to cover said insulator strips and said first gate insulator film;

(e) anisotropically etching said first conductor film to produce floating gate electrodes lower in height than said strips on said first gate insulator film without using a mask, each of said floating gate electrodes being adjacent to corresponding one of said strips, and having at least one oblique or curved side face at an opposite end to said corresponding one of said strips;

(f) selectively removing said first gate insulator film except for parts underlying said floating gate electrodes;

(g) forming a second gate insulator film to cover said floating gate electrodes and exposed parts of said active regions;

(h) forming a second insulator film to cover said second gate insulator film and said insulator strips, said second conductor film being etched back to flatten a surface of said second conductor film until tops of said strips are exposed from said second conductor film;

(i) patterning said second conductor film to produce control gate electrodes;

(j) forming drain regions and source regions in said active regions, respectively after the insulator strips are removed;

(k) forming an interlayer insulator film to cover all over said substrate and bit contact holes in said interlayer insulator film; and (l) forming bit lines extending along said second direction on said interlayer insulator film, said bit lines being arranged at interval and being in contact with corresponding ones of said drain regions.

8. The method as claimed in claim 7, wherein each of said floating gate electrodes has a first oblique side face connected to a bottom face of said floating gate electrode at a first predetermined inclination angle to said bottom face, and a second oblique side face connected to said first oblique side face at a second predetermined inclination angle to said bottom face, wherein said first predetermined angle is greater than said second predetermined angle.

9. The method as claimed in claim 7, wherein each of said control gate electrodes has at least one oblique or curved side face connected to a bottom face of said control gate electrode.

10. A fabrication method of a flash electrically erasable programmable read-only memory device with the split-gate type memory cells, said method comprising the steps of:

(a) forming a patterned field insulator film on a semiconductor substrate to produce active regions at said substrate and uncovered parts of said substrate, said active regions being arranged at intervals in a first direction and a second direction perpendicular to said first direction;

(b) forming insulator strips extending along said first direction on said substrate at intervals, said strips being in contact with said active regions and said field insulator film;

(c) selectively forming a first gate insulator film on uncovered parts of said substrate, respectively;

(d) forming a first patterned conductor film to cover said insulator strips and said first gate insulator film;

(e) anisotropically etching said first conductor film to produce floating gate electrodes lower in height than said strips on said first gate insulator film without using a mask, each of said floating gate electrodes being adjacent to corresponding one of said strips, and having an oblique side face at opposite end to said corresponding one of said strips;

(f) selectively removing said first gate insulator film except for parts underlying said floating gate electrodes;

(g) forming a second gate insulator film to cover said floating gate electrodes and exposed parts of said active regions;

(h) forming a second insulator film to cover said second gate insulator film and said insulator strips, said second conductor film being selectively etched to produce control gate electrodes;

(i) forming drain regions and source regions in said active regions, respectively after said insulator strips are removed;

(j) forming an interlayer insulator film to cover all over said substrate and bit contact holes in said interlayer insulator film; and (k) forming bit lines extending along said second direction on said interlayer insulator film, said bit lines being arranged at intervals and being in contact with corresponding ones of said drain regions.

11. The method as claimed in claim 10, wherein each of said floating gate electrodes has a first oblique side face connected to a bottom face of said floating gate electrode at a first predetermined inclination angle to said bottom face, and a second oblique side face connected to said first oblique side face at a second predetermined inclination angle to said bottom face, wherein said first predetermined angle is greater than said second predetermined angle.

12. The method as claimed in claim 10, wherein each of said control gate electrodes has at least one oblique or curved side face connected to a bottom face of said control gate electrode.

13. In a fabrication method of a flash electrically erasable programmable read-only memory device with the split-gate type memory cells, said method comprising the steps of:

forming a first gate insulator film on a semiconductor substrate;

forming a first conductor film on said first gate insulator film;

patterning said first conductor film to produce floating gate electrodes without using a mask and to expose a portion of said substrate, each of said floating gate electrodes having at least one oblique or curved side face;

forming a second gate insulator film to cover said floating gate electrodes and said exposed portion of said substrate;

forming a second conductor film on said second gate insulator film; and patterning said second conductor film to produce control gate electrodes;

forming drain regions and source regions in said substrate in self-alignment to said control gate electrodes, respectively, each of said source regions being formed in self-alignment to said control gate electrodes which correspond to different drain regions, respectively, wherein electric field concentration is restrained in said floating gate electrodes due to said at least one oblique or curved side face of said first conductor film, and gate lengths of said floating gate electrodes are substantially equal, and each of said drain regions are commonly used by adjacent memory cells.

14. The method as claimed in claim 13, wherein each of said floating gate electrodes has a first oblique side face connected to a bottom face of said floating gate electrode at a first predetermined inclination angle to said bottom face, and a second oblique side face connected to said first oblique side face at a second predetermined inclination angle to said bottom face, wherein said first predetermined angle is greater than said second predetermined angle.

15. The method as claimed in claim 13, wherein each of said control gate electrodes has at least one oblique or curved side face connected to a bottom face of said control gate electrode.

16. The method as claimed in claim 15, further comprising a step of anisotropically etching said control gate electrodes to form said oblique or curved side faces of said control gate electrodes.

17. A fabrication method of a flash electrically erasable programmable read-only memory device with the split-gate type memory cells, said method comprising the steps of:

(a) forming a patterned field insulator film on a semiconductor substrate to produce active regions at said substrate and uncovered parts of said substrate, said active regions being arranged at intervals in a first direction and a second direction perpendicular to said first direction;

(b) forming insulator strips extending along said first direction on said substrate at intervals, said strips being in contact with said active regions and said field insulator film;

(c) selectively forming a first gate insulator film on uncovered parts of said substrate, respectively;

(d) forming a first patterned conductor film to cover said insulator strips and said first gate insulator film;

(e) anisotropically etching said first conductor film to produce floating gate electrodes lower in height than the strips on said first gate insulator film without using a mask, each of said floating gate electrodes being adjacent to corresponding one of said strips, and having an oblique side face at an opposite end to said corresponding one of said strips;

(f) selectively removing said first gate insulator film except for parts underlying said floating gate electrodes;

(g) forming a second gate insulator film to cover said floating gate electrodes and exposed parts of said active regions;

(h) forming a second conductor film to cover said second gate insulator film and said insulator strips, said second conductor film is selectively etched to produce control gate electrodes;

(i) selectively etching exposed part of said field oxide film (j) forming drain regions and source regions in said active regions in self-alignment to said control gate electrodes, respectively, each of said source regions being formed in self-alignment to said control gate electrodes which belong to different ones of said drain regions, respectively;

(k) forming an interlayer insulator film to cover all of said substrate and forming bit contact holes in said interlayer insulator film; and (l) forming bit lines extending along said second direction on said interlayer insulator film, said bit lines being arranged at intervals and in contact with corresponding ones of said drain regions.

18. The method as claimed in claim 17, wherein each of said floating gate electrodes has a first oblique side face connected to a bottom face of said floating gate electrode at a first predetermined inclination angle to said bottom face, and a second oblique side face connected to said first oblique side face at a second predetermined inclination angle to said bottom face, wherein said first predetermined angle is greater than said second predetermined angle.

19. The method as claimed in claim 17, wherein each of said control gate electrodes has at least one oblique or curved side face connected to a bottom face of said control gate electrode.

* * * * *

UNITED STATES PATENT AND TRADEMARK OFFICE
CERTIFICATE OF CORRECTION

PATENT NO. : 5,492,846
DATED : February 20, 1996
INVENTOR(S) : Hideki HARA

It is certified that error appears in the above-indentified patent and that said Letters Patent is hereby corrected as shown below:

Column 1, line 46, after "N$^+$-type" insert -- drain regions 208A with rectangular plane shapes and a plurality of --.

Column 1, line 65, delete both occurrences of "$\div$" and insert -- $\approx$ --.

Column 4, line 30, delete "$T_w$" and insert --$t_w$--.

Column 7, line 12, delete both occurrences of "$\div$" and insert -- $\approx$ --.

Column 10, line 31, delete both occurrences of "$\div$" and insert -- $\approx$ --.

Column 12, line 15, delete "104" and insert --105--.

UNITED STATES PATENT AND TRADEMARK OFFICE
CERTIFICATE OF CORRECTION

PATENT NO. : 5,492,846
DATED : February 20, 1996
INVENTOR(S) : Hideki HARA

It is certified that error appears in the above-indentified patent and that said Letters Patent is hereby corrected as shown below:

Column 16, line 4, delete "insulator" and insert --conductor--.

Column 16, line 64, delete "insulator" and insert --conductor--.

Column 18, line 39, after "film" insert --and said insulator strips using said control gate electrodes--.

Signed and Sealed this

Twenty-third Day of July, 1996

Attest:

BRUCE LEHMAN

*Attesting Officer*  *Commissioner of Patents and Trademarks*